(12) United States Patent
Hu et al.

(10) Patent No.: US 8,509,365 B2
(45) Date of Patent: Aug. 13, 2013

(54) BLIND ADAPTIVE FILTER FOR NARROWBAND INTERFERENCE CANCELLATION

(75) Inventors: Gang Hu, Shanghai (CN); Yuanfei Nie, Shanghai (CN); Meiwu Wu, Shanghai (CN)

(73) Assignee: Montage Technology (Shanghai) Co. Ltd., XU Hui District, Shanghai (CN)

( * ) Notice: Subject to any disclaimer, the term of this patent is extended or adjusted under 35 U.S.C. 154(b) by 333 days.

(21) Appl. No.: 12/933,416

(22) PCT Filed: Aug. 3, 2010

(86) PCT No.: PCT/CN2010/075662
§ 371 (c)(1),
(2), (4) Date: Sep. 18, 2010

(87) PCT Pub. No.: WO2011/153727
PCT Pub. Date: Dec. 15, 2011

(65) Prior Publication Data
US 2011/0305306 A1 Dec. 15, 2011

(30) Foreign Application Priority Data
Jun. 12, 2010 (CN) .......................... 2010 1 0199697

(51) Int. Cl.
*H03D 1/04* (2006.01)
(52) U.S. Cl.
USPC .............................. 375/346; 375/350; 708/290

(58) Field of Classification Search
None
See application file for complete search history.

(56) References Cited

U.S. PATENT DOCUMENTS
5,838,740 A * 11/1998 Kallman et al. .............. 375/346

FOREIGN PATENT DOCUMENTS
WO PCT/CN2010/075662 3/2011

* cited by examiner

*Primary Examiner* — Leon-Viet Nguyen
(74) *Attorney, Agent, or Firm* — Global IP Services; Tianhua Gu

(57) ABSTRACT

The present invention relates to a blind adaptive filter for narrowband interference cancellation, which includes an adaptive filter, a delay unit coupled to the adaptive filter for generating a delayed signal with a predetermined delay length from the output signal of the adaptive filter, and an error calculation unit coupled to the adaptive filter and the delay unit. The error calculation unit compares the output signal from the adaptive filter and the delayed signal from the delay unit to extract error information, and feedback the first error information to the adaptive filter. The first error information is formed of a transfer function including a number of coefficients, and used to adjust the adaptive filter and remove interference in the next input signal. The disclosed technique is also applicable in wideband receivers, as well as resisting multiple strong narrowband interferences having a frequency sweep rate of tens of milliseconds.

18 Claims, 3 Drawing Sheets

BLIND ADAPTIVE FILTER FOR NARROWBAND INTERFERENCE CANCELLATION

CROSS REFERENCE TO RELATED PATENT APPLICATION

The present application is the US national stage of PCT/CN2010/075662 filed on Aug. 3, 2010, which claims the priority of the Chinese patent application No. 201010199697.1 filed on Jun. 12, 2010, which application is incorporated herein by reference.

BACKGROUND OF THE INVENTION

1. Field of Invention

The present invention relates to noise reduction in broadband communication, specifically to a blind adaptive filter for narrowband interference cancellation, and more specifically to a blind adaptive filter for narrowband interference cancellation which adjusts filter parameters according to the error information obtained after the processing of filtered output signal from the adaptive filter and the delayed output signal.

2. Description of Related Arts

The transport performance of a wideband mobile communication system can be seriously degraded by narrowband interferences from the same channel or from adjacent channels in both analog and digital systems. Noise filtering is the most essential part for any electronic information processing. It could be adopted to extract desired signals from complicated signals and cancel noise or interference at the same time. In narrowband frequency filtering, signals of specific frequency band are expected to minimally attenuate while other undesired signals are greatly attenuated to prevent undesired signals going through. Frequency filter circuit in the electronic system which has been widely applied in communication systems is usually very complicated and the product performance is directly determined by the performance of filters. Therefore, many countries have paid attention to the theory research and product development of filters.

If the interference is weak enough that the synchronization can still be achieved, a number of methods could be applied combined with data to enhance desired signals, to suppress frequency based interference, such as traditional forward or feedback equalization, soft demapper, iterative equalization, and turbo equalization, with significant performance improvement. Discussion of these methods can be found, for example, in publications on Code division multiple access (CDMA) and Orthogonal frequency-division multiplexing (OFDM) system. CDMA is a form of spread-spectrum signaling, since the modulated coded signal has a much higher data bandwidth than the data being communicated. OFDM has developed into a popular scheme for wideband digital communication, whether wireless or over copper wires, used in applications such as digital television and audio broadcasting, wireless networking and broadband internet access. Unfortunately, when interference increases beyond a critical level, signal synchronization fails.

In the past thirty years, many different circuits or systems have been proposed for enhancing desired signals, or separating/canceling noise or different signal frequencies affecting a desired signal. In these methods mentioned above, circuits with different architectures have different abilities to suppress or remove the interference. Although some methods that use the training sequence or some known pilots are effective, the blind ones seem more attractive. A promising technique to reduce narrowband noise is the blind adaptive filtering method for receivers of communication systems. One kind of the new blind adaptive filtering methods applies a notch filter to remove the interference after obtaining its centre frequency. In this technique, interference signal tracking is based on spectrum power density analysis, often acquired through techniques such as Fast Fourier Transform (FFT). However, this method has the least robustness in tracking the change of the interference, even when FFT is performed frequently.

Another blind adaptive filtering method applies adaptive signal processing. An adaptive filter belongs to the category of modern filters, compared with a fixed filter. The fixed filter belongs to the category of classical filters and has fixed filter frequencies. Compared with the fixed filter, the adaptive filter has more extensively applicable scope because the frequency of adaptive filter can be adjusted by the filter itself to meet changing conditions of input signals. Without any prior knowledge about signals or noise, the adaptive filter could automatically adjust the filter parameters of this moment according to the filter parameters obtained a moment ago to adapt to the statistical properties of unknown or random changing signals or noise and achieve optimal filtering. The adaptive filter is a Wiener filter that self-adjusts its parameters according to an optimizing algorithm to meet changing conditions of input signals.

A typical adaptive filter includes two parts: a filter circuitry and an adaptive algorithm to optimize the filter coefficients. The filter circuitry can adopt a Finite Impulse Filter (FIR) circuit or an Infinite Impulse Response (IIR) filter circuit. An FIR filter has a number of useful properties, such as an inherent stability, simplicity, and no feedback required, which sometimes make it preferable to an IIR filter.

FIG. 1 is a block diagram of a conventional adaptive filter. Input signal x(n) 101 is sent into the Delay Unit 110 and the Adaptive Filter 130. An Error Calculation Unit 120 compares the delayed signal 115 and the output signal Y(n) 135 to obtain error information e(n) 125. Error information e(n) 125 is then sent to the Adaptive Filter 130 for adjusting filter parameters, shown below:

$$y(n) = \sum_i h_n(i) x(n-i) \tag{1}$$

$$h_n(i) = h_{n-1}(i) + \mu \cdot conj(x(i)) \cdot e(i) \tag{2}$$

$$e(i) = x(n-D) - y(n), \tag{3}$$

where $h_n(i)$ is the transfer function, $\mu$ is a constant, conj is conjugation function, D is the delay length. Error function e(i) is minimized through the adjustment.

FIG. 2 is a schematic view of a conventional adaptive filter (prior art). An adaptive filter designed according to specified architecture usually has an adaptive algorithm meeting a certain criteria. The algorithm of adaptive filer always adopts various criteria as algorithms basis. In general, there are two criteria: the Least Mean Square (LMS) criterion and the Least Squares (LS) criterion. The Least Mean Square algorithm minimizes the mean square value of the output error sequence $e(i)=x(n-D)-y(n)$, and adjusts weight coefficients according to the criterion.

A number of references for adaptive filters, such as U.S. Pat. Nos. 4,052,559, 4,238,746, 005,325,204, 4,673,982, 4,524,424, 4,420,815, and 6,976,044, the Proceeding of the IEEE, vol. 63, no. 12, December 1975, pp. 1692-1716, and "Adaptive noise canceling" by Widrow et. al. relate to the least mean square approximation to the Wiener-Hoff filter.

The above methods use IIR or FIR filters which remove interference and update filter coefficients by the cross-correlation between the filter output and the input replica's delayed signal. However, the optimization convergence speed is very slow and only interference with a given spectral shape is removed. Therefore, these techniques can not apply to more general situations, for example, in cases of frequency hopping or fast shifting centre frequency.

Therefore, an adaptive filter with better performance and faster convergence speed is desired.

SUMMARY OF THE INVENTION

An object of the present invention is to provide a blind adaptive filter for narrowband interference cancellation which could be widely applied.

Another object of the present invention is to provide a blind adaptive method for narrowband interference cancellation for wideband communication system.

In order to accomplish the above objects, the blind adaptive filter apparatus for narrowband interference cancellation provided in the present invention comprises: an adaptive filter receiving an input signal and releasing an output signal; a first delay unit coupled to the adaptive filter for generating a first delayed signal from the output signal of the adaptive filter, wherein the first delayed signal has a predetermined first delay length; and an error calculation unit coupled to the adaptive filter and the first delay unit, wherein the error calculation unit compares the output signal from the adaptive filter and the first delayed signal from the first delay unit to extract first error information, and feedback the first error information to the adaptive filter, wherein the first error information is formed of a error function including coefficients, and wherein the first error information is used to adjust the adaptive filter and remove interference in the next input signal.

An exemplary blind adaptive method for narrowband interference cancellation for wideband communication system, consistent with the current invention, comprises the following steps:

(1) receiving an input signal and generating a filtered output signal by an adaptive filter;
(2) delaying the filtered output signal by a first delay length;
(3) performing coefficients' calculation of the filtered output signal from the adaptive filter and the delayed output signals to obtain error information;
(4) providing the error information feedback to the adaptive filter; and
(5) adjusting adaptive filter parameters by the adaptive filter according to the error information feedback to remove interference of next input signal.

In addition, the blind adaptive filter apparatus for narrowband interference cancellation could be combined with Adjacent Channel Interference (ACI) filter to cancel narrowband interference and adjacent channel interference. In addition, the blind adaptive filter apparatus for narrowband interference cancellation could be applied in sub-band system to cancel narrowband interference in each sub-band.

In summary, the difference between the blind adaptive filter for narrowband interference cancellation in the present invention and the conventional adaptive filer is that the blind adaptive filter in the present invention performs coefficients' calculation of transfer function coefficients by comparing the output signal from the adaptive filter and the delayed output signal, while the conventional filter performs coefficients' calculation by comparing the output signal from the adaptive filter and the delayed input signal without delaying the output signal. For the former, the adaptive filter will make the signal shape flat which results in changing the channel response to generate a lot of echoes and increases the complexity for the whole receiver. Besides it, when interference is moderate strong the filter will not work well as that in the strong case. But the adaptive filter disclosed in the present invention tracks the change of the interference signals more accurately and reduces it more effectively with the channel response changing little.

DETAIL DESCRIPTION OF THE INVENTION

The present invention is further explained in detail according to the accompanying drawings. It should be noted that figures are schematic representations of the embodiments, and not drawn to scale.

Figure 1:
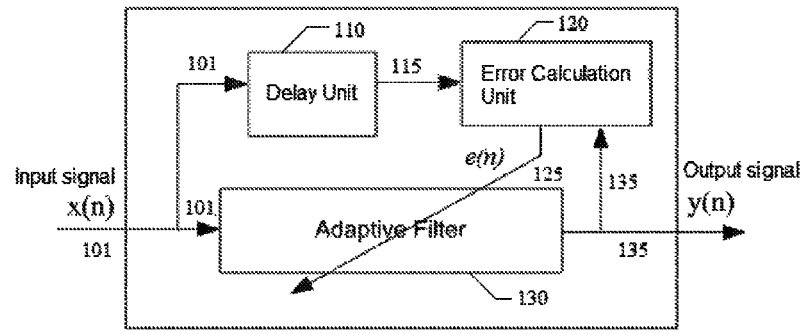
FIG. 1 is a block diagram of a conventional adaptive filter.
Figure 2:
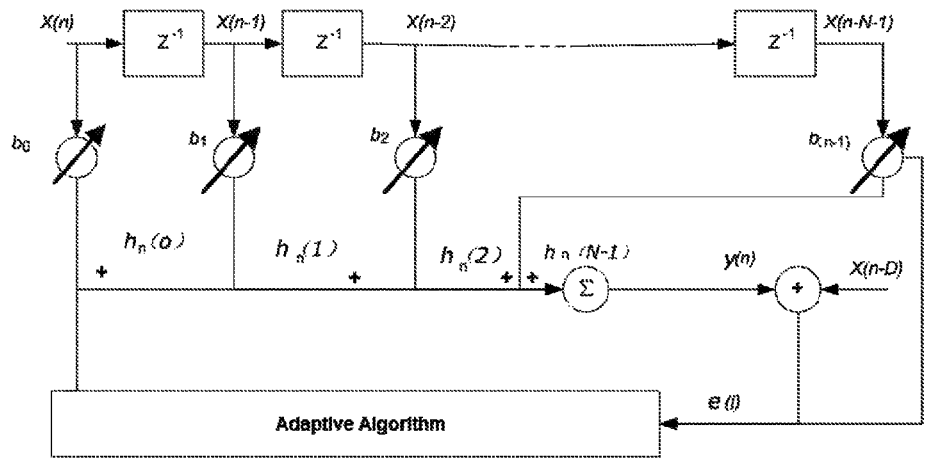
FIG. 2 is a schematic view of a conventional adaptive filter circuit.
Figure 3:
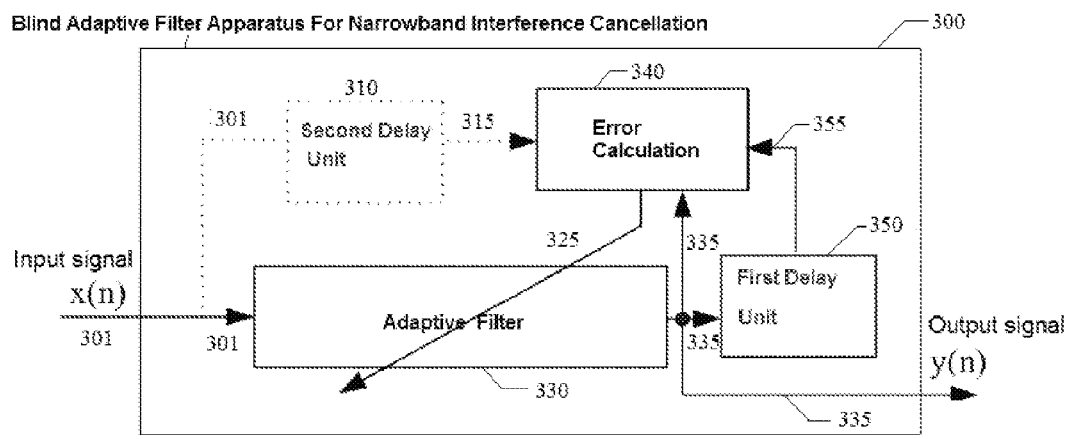
FIG. 3 is an architectural block diagram of a basic blind adaptive filter for narrowband interference cancellation consistent with the present invention.

FIG. 3 illustrates a blind adaptive filter apparatus for narrowband interference cancellation consistent with the present invention. The blind adaptive filter includes an adaptive filter 330, a first delay unit 350, an error calculation unit 340, and a second delay unit 310.

The adaptive filter 330 receives an input signal x(n) 301, generating an output signal y(n) 335 through the filtering process. The adaptive filter 330 can be one be FIR filter or IIR filter. The inner architectures of FIR filter and IIR filter have been known by the technicians of this field and will not be described here. Besides, the technicians could choose different adaptive filter regarding to different applied scenarios.

The first delay unit 350 coupled to the adaptive filter 330 delays the adaptive filter's output signals 335 by a first delay length. Typically, the first delay length is determined depending on the system's communication mode, for example, a sub-band communication system would adopt a different delay length than a single-band communication system. Besides, delayed output signal can be the current output signal y(n), but can also be the prior output signals from the adaptive filter 330.

The error calculation unit 340 coupled to the adaptive filter 330 and the first delay unit 350 is applied for performing coefficients' calculation of the current output signal from the adaptive filter 330 and output signal 355 from the first delay unit 350 to extract first error information, then giving the first error information feedback to the adaptive filter 330 for it to adjust filter parameters and remove interference of next input signal. Second or higher moment norm could be used in objective functions calculation. It should be noted that the higher the moment of norm is, the better the anti-interference performs, however, the more complicated the circuit will be. Therefore, in practice, a norm with optimized moment is selected in error calculation as required.

In this embodiment, the following calculation provides the error calculation derived from input and output signals:

$$\vec{x}(n) = [x(n-N+1)x(n-N+2) \ldots x(n-1)x(n)] \quad (4)$$

$$\vec{h}(n) = [h(n-N+1)h(n-N+2) \ldots h(n-1)h(n)] \quad (5)$$

then the adaptive filter output y(n) could be expressed as:

$$y(n) = \vec{x}(n)\vec{h}(n)^T \quad (6)$$

where N is the adaptive filter length, T is transposed operator, * is conjugate operator. Minimizing error information (that is objective function) is minimizing the norm in $$C(n_1, n_2, \ldots, n_k) = E\{y(n)y(n+n_1) \ldots y(n+n_k)\} \quad (7),$$

or $$f = E\{\|C(n_1, n_2, \ldots, n_k)\|^p\} \to \min f \quad (8)$$

where, $\|\ \|^p$ is a p moment norm, more particularly, and $\|\ \|$ is a second moment norm.

In a simplified version, the following is defined:

$$f = E\{\|y(n)y*(n-S/2)\|\} \to \min f, \quad (9)$$

Therefore, $$\frac{\partial f}{\partial h(i)} = 0, \text{ for } i = 0, 1, \ldots, N-1 \quad (10)$$

In Least Mean Square (LMS) calculation, the following result under FIR architecture is achieved.

The error vector is expressed as $$\vec{e}(n) = [e(0)e(1) \ldots e(N-2)e(N-1)], \quad (11)$$

$$e(i) = y(n-1)*|y(n-S/2-1)|x(n-i) + y(n-1-S/2)*|y(n-1)||x(n-i-S/2),$$

$$i = 0, \ldots, N-1, \quad (12)$$

$$h(i) = h(i) - \mu e(i) \quad (13)$$

Define the output vector:

$$\vec{m}_S(n) = [y(n)y(n-1) \ldots y(n-S+2)y(n-S+1)],$$

In order to measure processing result, we define a correlation sum of the output vector $$E(n) = \vec{m}_{S/2}(n-1)\vec{m}_{S/2}(n-1-S/2)^T.$$

It should be noted that the minimum error was calculated using least-mean-square (LMS) algorithm in a time domain. In addition, recursion least square method (RLS) or other algorithms can be implemented not only in a time domain, but also in a transform domain such as a frequency domain, for which we will not go into the details here.

Consistent with the current invention, an exemplary blind adaptive filter includes further a second delay unit 310 can in the apparatus to provide delay in the input signal 301 x(n) of the adaptive filter 330 by a predetermined second delayed length. The delayed signal 315, which forms of the input signal 301 x(n) combined with the second delay length from the second delay unit 310, is joined at the error calculation unit 340 with the output signal 335 from the Adaptive filter 330 and the delayed output signal 355 from the first delay unit 350. The error calculation unit 340 then performs transfer calculation of the function's coefficients x(n) after obtaining the corresponding second error information for the adaptive filter 330 to adjust filter parameters.

Furthermore, if the correlation of output signal of the adaptive filter y(n) 335 is detected to be lower than a given threshold, the adaptive narrowband interference cancellation circuit becomes unnecessary, therefore it can be bypassed to save power consumption. Therefore, a deterministic unit could be installed in the apparatus to estimate if the first error information calculated by the error calculation unit is lower than the given threshold in order to determine if the input signal should be transferred into the adaptive filter for interference cancellation. If the first error information calculated is lower than the given threshold, then the input signal x(n) 301 should be directly transferred into subsequent decoding unit for direct decoding without filtering through the adaptive filter.

The blind adaptive filter apparatus 300 for narrowband interference cancellation can be widely applied, for example, it can be combined with an Adjacent Channel Interference (ACI) filter to remove interferences in a narrowband or from an adjacent channel. In addition, it could be applied in sub-band system to remove narrowband interference in each sub-band.

Figure 4:
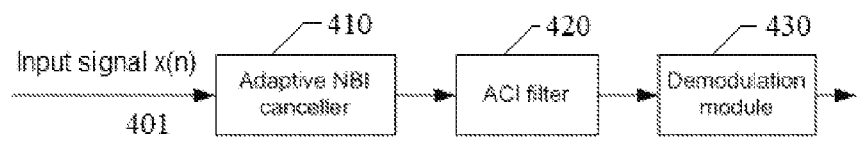
FIG. 4 is a block diagram of the first type blind adaptive filter apparatus for narrowband interference cancellation according to the first embodiment of the present invention.

FIG. 4 is a diagram of an integrated blind adaptive filter apparatus for narrowband interference (NBI) cancellation in a wideband communication system, including an adaptive NBI (narrow bank interference) canceller 410, an ACI filter 420, and a demodulation module 430. In this system, input signal x(n) 401 is filtered via the adaptive NBI canceller 410 and ACI filter 420 successively, and finally the input signal is demodulated through the demodulation module 430 to obtain the communication information through demodulation.

Figure 5:
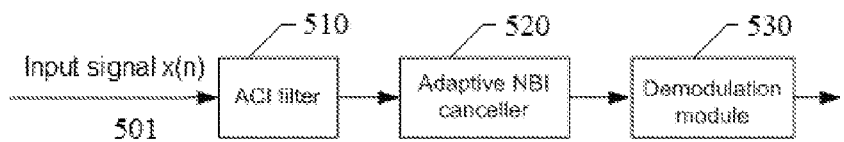
FIG. 5 is a block diagram of the second type blind adaptive filter apparatus for narrowband interference cancellation according to the second embodiment of the present invention.

FIG. 5 is a schematic view of another wideband communication system comprising a blind adaptive filter apparatus for narrowband interference cancellation. Compared with the wideband communication system shown in FIG. 4, the difference is the order of NBI and ACI filtering. In FIG. 5, narrowband interference cancellation is moved after the ACI filtering. Input signal x(n) 501 is first filtered via the ACI filter 510 before being filtered via the adaptive NBI canceller 520 through the blind adaptive filter apparatus for narrowband interference cancellation, and finally the input signal is demodulated through the demodulation module 530.

Figure 6:
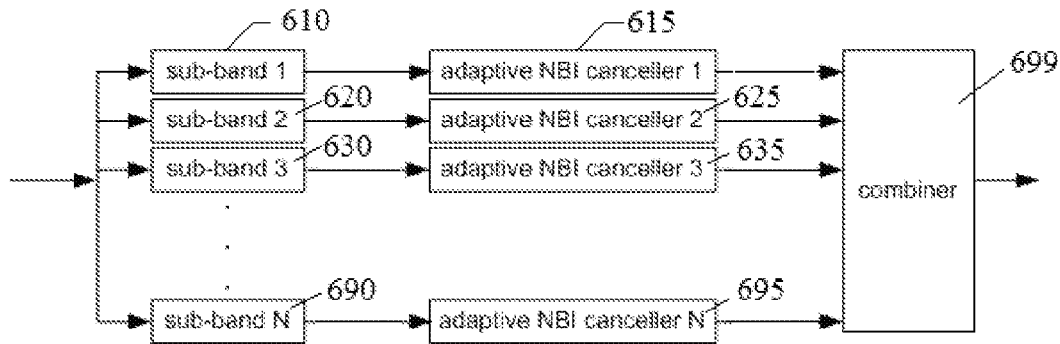
FIG. 6 is a schematic view of the third type blind adaptive filter apparatus for narrowband interference cancellation according to the third embodiment of the present invention.

FIG. 6 is a schematic view of a sub-band wideband communication system having multiple adaptive NBI cancellers in a multiple sub-band system. The multiple sub-band system includes multiple sub-band access units 610, 620, 630, . . . 690, for sub-band access unit 1, sub-band access unit 2, sub-band access unit 3 . . . , sub-band access unit N, for the access of different sub-band signals. Each sub-band access unit is coupled to a blind adaptive filter apparatus for narrowband interference cancellation. The adaptive NBI canceller 1 615 is coupled to the sub-band unit 1 610, the adaptive NBI canceller 2 625 is coupled to the sub-band 2 620, the adaptive NBI canceller 3 635 is coupled to the sub-band 3 630 . . . , the adaptive NBI canceller cancellation N 690 is coupled to the sub-band N 695. The sub-band signals with narrowband interference cancelled are transferred into the combiner 699 to form integrated communication information.

It should be noted that structures of the blind adaptive filter apparatus for narrowband interference cancellation in the communication systems as shown in FIG. 4 to FIG. 6 share a few common components, such as the adaptive filter, a delay unit, and an error calculation unit. Additional structures for example, the second delay unit such as the second delay unit 310 in FIG. 3 and the deterministic unit such as the demodulation modules 430 and 530 in FIG. 4 and FIG. 5 are formed in some applications.

Figure 7:
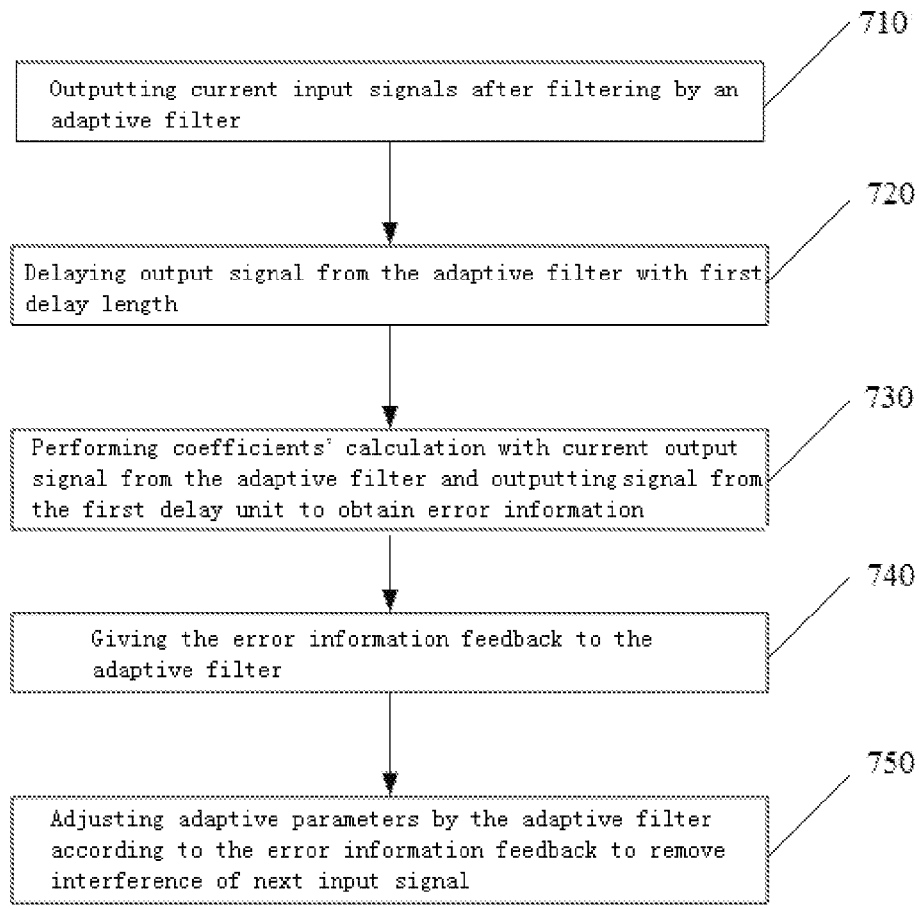
FIG. 7 is an operational flow chart of a blind adaptive filter for narrowband interference cancellation in a wideband communication system, consistent with the present invention.

FIG. 7 is an operational flow chart of a blind adaptive filter for narrowband interference cancellation in a wideband communication system, consistent with the present invention. First in step 710, an input signal x(n) is filtered by the adaptive filter (such as FIR filter or IIR filter) into an output signal y(n); in step 720, a delayed signal is generated from the output signals y(n) (including the current output signal and the previous output signal) with a predetermined delay length; in step 730, calculation of transfer function coefficients is performed with the current output signal y(n) and the delayed signals (for example, an error module can be implemented in time domain, or other transform domains using LMS or RLS algorithm with second or higher moment norm) to obtain error information e(n) (could be extracted using LMS or RLS); in step 740, the error information e(n) is feedback to the adaptive filter, which in step 750, adjusts adaptive parameters according to the error information feedback to remove the interference of next input signal x(n+i).

In summary, the blind adaptive filter apparatus for narrowband interference cancellation can perform calculation of transport function coefficients on output signals and the delayed output signals from the adaptive filter to extract error information for adjusting the adaptive filter parameters. This technique has wide applications in broadband communication systems, such as, the CMMB (China Multimedia Mobile Broadcasting) receivers, digital television receivers and telegraphic receivers. The advantages of the disclosed apparatus include cancellation of multiple strong narrowband interferences having a frequency sweep rate of up to tens of milliseconds. In comparison with any existing adaptive method, the adaptive method in the present invention has little or no effect on the superimposing channels and has less degradation for receiver's performances. In addition, the blind adaptive filter in the present invention has faster response speed and higher traceability. Compared with the traditional notch filter, the adaptive filter in the present invention does not need to know the spectral shapes of undesired signals therefore avoiding false detections.

The above description of the detailed embodiments are only to illustrate the preferred implementation according to the present invention, and it is not to limit the scope of the present invention, Accordingly, all modifications and variations completed by those with ordinary skill in the art should fall within the scope of the present invention defined by the appended claims.

What is claimed is:

1. An apparatus for narrowband interference cancellation, comprising:
    an adaptive filter receiving an input signal and releasing an output signal;
    a first delay unit coupled to the adaptive filter for generating a first delayed signal from the output signal of the adaptive filter, wherein the first delayed signal has a predetermined first delay length;
    an error calculation unit coupled to the adaptive filter and the first delay unit,
    wherein the error calculation unit compares the output signal from the adaptive filter and the first delayed signal from the first delay unit to extract first error information, and feedback the first error information to the adaptive filter,
    wherein the first error information is formed of an error function including coefficients, and
    wherein the first error information is used to adjust the adaptive filter and remove interference in the next input signal; and
    a second delay unit, the second delay unit generating a predetermined second delay length to the input signals and sending delayed input signals to the error calculation unit to obtain corresponding second error information for the adaptive filter to adjust the adaptive filter parameters.

2. The apparatus for narrowband interference cancellation as in claim 1, wherein least mean square algorithm is adopted to calculate the first error information.

3. The apparatus for narrowband interference cancellation as in claim 1, wherein recursion least square algorithm is adopted to calculate the first error information.

4. The apparatus for narrowband interference cancellation as in claim 1, wherein second or higher moment norm is adopted in corresponding objective functions calculation while using different algorithms to calculate the first error information.

5. The apparatus for narrowband interference cancellation as in claim 1, wherein the first delay length is predetermined according to the applied scenarios.

6. The apparatus for narrowband interference cancellation as in claim 1, wherein the calculation of coefficients is implemented in time domain.

7. The apparatus for narrowband interference cancellation as in claim 1, wherein calculation the coefficients is implemented in frequency domain.

8. The apparatus for narrowband interference cancellation as in claim 1, wherein the adaptive filter is a finite impulse filter.

9. The apparatus for narrowband interference cancellation as in claim 1, wherein the adaptive filter is an infinite impulse response filter.

10. The apparatus for narrowband interference cancellation as in claim 1, wherein the first delay unit extracts the current output signal and the previous output signal, delays them respectively, and then implements calculation of the coefficients.

11. The apparatus for narrowband interference cancellation as in claim 1, further comprising a deterministic unit which is adopted to determine if the input signal should be transferred into the adaptive filter for interference cancellation by estimating if the first error information calculated by the error calculation unit is lower than a given threshold in order.

12. A blind adaptive method for narrowband interference cancellation comprises the following steps:
    (1) receiving an input signal and generating a filtered output signal by an adaptive filter;
    (2) delaying the filtered output signal by a first delay length the filtered out signal comprises the current filtered output signals and the previous filtered output signals
    (3) performing coefficients' calculation of the filtered output signal from the adaptive filter and the delayed output signals to obtain error information;
    (4) providing the error information feedback to the adaptive filter; and
    (5) adjusting adaptive filter parameters by the adaptive filter according to the error information feedback to remove interference of next input signal;
    (6) the delayed output signals further comprises the current output signals and the previous output signals.

13. The blind adaptive method for narrowband interference cancellation as in claim 12, wherein least mean square algorithm is adopted to calculate the first error information.

14. The blind adaptive method for narrowband interference cancellation as in claim 12, wherein recursion least square method is adopted to calculate the first error information.

15. The blind adaptive method for narrowband interference cancellation as in claim 12, wherein second or higher moment norm is adopted in the transfer functions while calculating the first error information using different algorithms.

16. The blind adaptive method for narrowband interference cancellation as in claim 12, wherein the first delay length is predetermined according to the applied scenarios.

17. The blind adaptive method for narrowband interference cancellation as in claim 12, wherein the adaptive filter is a finite impulse filter.

18. The blind adaptive method for narrowband interference cancellation as in claim 12, wherein the adaptive filter is an infinite impulse response filter.

* * * * *